United States Patent [19]

Aoki et al.

[11] 4,183,039
[45] Jan. 8, 1980

[54] LIGHT EMITTING SEMICONDUCTOR DEVICE

[75] Inventors: Masaaki Aoki, Kokubunji; Yuichi Ono, Tokyo; Makoto Morioka, Tokyo; Kazuhiro Ito, Tokyo; Mitshiuro Mori, Kokubunji; Kazuhiro Kurata, Hachioji, all of Japan

[73] Assignee: Hitachi, Ltd., Japan

[21] Appl. No.: 913,055

[22] Filed: Jun. 6, 1978

[30] Foreign Application Priority Data

Jun. 10, 1977 [JP] Japan .................................. 52-67895

[51] Int. Cl.² ............................................. H01L 33/00
[52] U.S. Cl. ......................................... 357/17; 357/18; 357/55
[58] Field of Search ............................ 357/17, 18, 55

[56] References Cited

U.S. PATENT DOCUMENTS

| | | | |
|---|---|---|---|
| 3,805,376 | 4/1974 | D'asaro | 29/500 |
| 3,900,864 | 8/1975 | Dapkus | 357/18 |
| 3,947,840 | 3/1976 | Croford | 340/324 M |
| 4,017,881 | 4/1977 | Ono | 357/18 |
| 4,032,944 | 6/1977 | Van Dongen | 357/17 |

Primary Examiner—Martin H. Edlow
Attorney, Agent, or Firm—Craig and Antonelli

[57] ABSTRACT

A light emitting semiconductor device wherein a p-n junction is defined by a ditch and wherein the ditch either extends to a low resistance layer or is away from the low resistance layer at most ½ of the width of the ditch is disclosed. It has the merit that the near field pattern is much more uniform than in a prior-art device.

11 Claims, 16 Drawing Figures

LIGHT EMITTING SEMICONDUCTOR DEVICE

LIST OF PRIOR ART (37 CFR 1. 56 (a))

The following reference is cited to show the state of the art:

U.S. Pat. No. 4,017,881 (Hitachi);

A light emitting semiconductor device wherein a p-n junction is defined by a ditch and wherein a light emitting surface is semispherical is disclosed.

However, no description is made of the depth of the ditch, nor is any disclosure given as to a highly doped region of a first conductivity type for making the near field pattern uniform.

BACKGROUND OF THE INVENTION

1. Field of the Invention

This invention relates to a light emitting device which exploits radiation in the p-n junction of a semiconductor. More particularly, it relates to a high-output light emitting device which can make the near field pattern of radiated light uniform.

2. Description of the Prior Art

A semiconductor light emitting device which is used as, e.g., a light source for exciting a solid-state laser and a light source for optical communication employs as its material a compound semiconductor crystal such as $Ga_{1-x}Al_xAs$. In such a device, light is emitted from a p-n junction when a forward voltage is applied thereto, and this emitted light radiates out from the exterior of the device.

As to such a semiconductor light emitting device, it has been proposed that both positive and negative electrodes are formed on one side of the device, that a compound semiconductor having a wide band gap is arranged on the other side or light emitting side and that the compound semiconductor arranged on the light emitting side is ground into the shape of a dome. It has been known that the light emitting device having this structure exhibits a remarkably high efficiency of producing light.

FIG. 1 shows an example of the light emitting device which has such a structure. Electrodes 6 and 11 are formed on an identical surface. The region of a p-n junction 10 is defined and isolated by a ditch 1.

Heretofore, the ditch 1 has been formed in a manner to reach a first conductivity type (p-type) crystal layer 4. In the light emitting device of such a structure, however, carriers from the outer electrode 11 towards the inner electrode 6 advance at the highest probability along a path close to the ditch 1, such as path 7 indicated by a broken line in FIG. 1. For this reason, the density of current injected into the p-n junction 10 becomes high in a part near the ditch 1, i.e., the peripheral part of the p-n junction and low in a central part.

As a result, the emission of light in the vicinity of the periphery of the p-n junction 10 becomes intenser than in the central part, and the near field pattern of light radiated from the p-n junction 10 does not become uniform in the direction of the plane of the p-n junction. This has often posed problems in optical application, for example, in a precision range finder.

SUMMARY OF THE INVENTION

An object of this invention is to solve the problem of the prior-art semiconductor light emitting device as described above, and to make homogeneous the current density to be injected into a p-n junction, thereby eliminating non-uniformity in the near field pattern in the plane of the p-n junction.

In order to accomplish the object, according to this invention, a p-n junction region is defined by a ditch, and the distance between the bottom of the ditch and a layer of a first conductivity type region of low resistance is made at most ½ of the width of the ditch, whereby the density of current to be injected into the p-n junction is made homogeneous.

DETAILED DESCRIPTION

Figure 1:
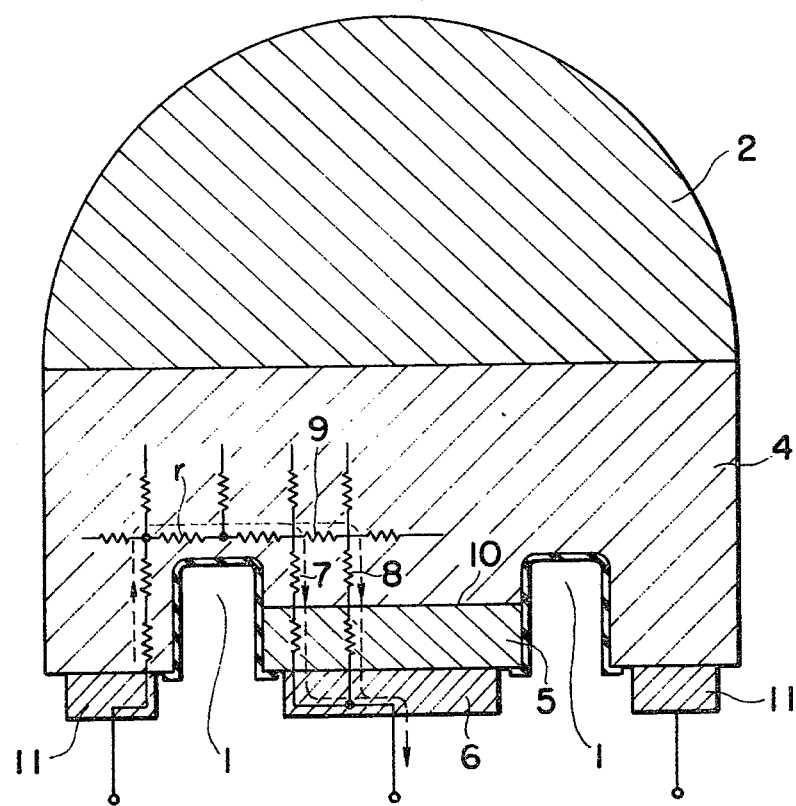
FIG. 1 is a sectional view for explaining the structure of a prior-art semiconductor light emitting device.

In the semiconductor light emitting device which has the structure shown in FIG. 1, the conducting path of carriers to be injected into the p-n junction 10 is determined by the magnitude of the sum of resistances throughout the path.

As illustrated in FIG. 1, the resistance sum in the crystal 4 can be deemed, in a model, a connection of resistance elements r each being per elementary piece having a unit volume. (In FIG. 1, numeral 5 designates a crystal layer of a second conductivity type, and numeral 2 indicates a semiconductor layer on the light taking-out side, which is ground into the shape of a dome.)

When the two conducting paths 7 and 8 of the carriers from the electrode 11 to the electrode 6 are compared, the resistance value of the path 8 is greater than that of the path 7 by the resistance element 9. The carriers therefore pass through the path 7 more easily than through the path 8.

In order to make the current density in the p-n junction 10 homogeneous, the value of the resistance element 9 which is the difference between the resistance values of the paths 7 and 8 may be approximated to the resistance of the metallic electrode to the utmost, thereby to make the resistance values of both the paths 7 and 8 equal.

This invention has been made on the basis of such an idea, and will be described in conjunction with embodiments.

Embodiment 1

Figure 2:
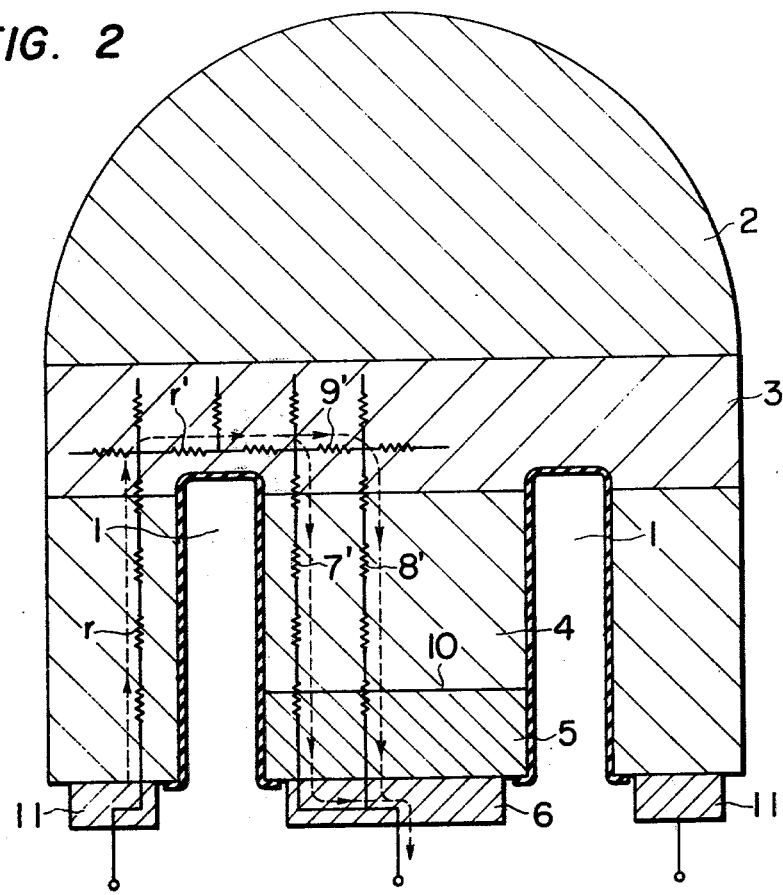
FIGS. 2 and 3 are views showing different embodiments of this invention.

As apparent from FIG. 2, a first conductivity type (p-type) crystal layer 3 which is highly doped with an impurity to the extent of exhibiting metallic conduction is interposed between a first conductivity type layer 2 having a wide band gap and for giving out light and another first conductivity type crystal layer 4. A ditch 1 is provided in a manner to reach the crystal layer 3.

The first conductivity type crystal layer 3 may have an impurity concentration of about $5 \times 10^{18}$ $cm^{-3}$–$5 \times 10^{20}$ $cm^{-3}$ and a thickness of about 0.03 μm or above, and it can be readily formed by the present-day technique of crystal growth. The thicker the crystal layer 3, the easier the formation of the ditch 1. Since, however, a crystal doped with large quantities of impurity exhibits a high light absorptivity, it is unfavorable to render the layer 3 very thick. Accordingly, the thickness of the crystal layer 3 needs to be determined by taking into account the facility of fabrication and the loss of emitted light, and it is selected from within a range of 0.03 μm–30 μm.

The ditch 1 surrounds a p-n junction 10 formed by the first conductivity type crystal layer 4 and a second conductivity type (n-type) crystal layer 5, and extends to the interior of the first conductivity type crystal layer 3.

When two conducting paths 7' and 8' of carriers in this case are compared, the resistance of the path 8' is greater by a resistance element 9' in the crystal layer 3 as apparent from FIG. 2. Since, however, the crystal layer 3 contains the large quantities of impurity as stated above, the value of the resistance element r' in the crystal layer 3 is negligibly small as compared with the value of a resistance element r in the first conductivity type crystal layer 4 and becomes substantially equal to the value of a resistance element of an electrode metal. As a result, the total resistances of the two conducting paths 7' and 8' become substantially equal, and the probabilities at which the carriers advance through the conducting paths 7' and 8' become equal. That is, the density of current to be injected into the p-n junction becomes homogeneous in the plane of the p-n junction, and light emission of a uniform near field pattern can be achieved.

Embodiment 2

The light emitting device of the preceding embodiment illustrated in FIG. 2 has the structure wherein the ditch 1 is so formed as to reach the interior of the first conductivity type low-resistance crystal layer 3. However, if the ditch 1 is close to the first conductivity type crystal layer 3 to a certain degree, substantially the same effect can be attained even when it is not in contact with the first conductivity type crystal layer 3.

Figure 3:
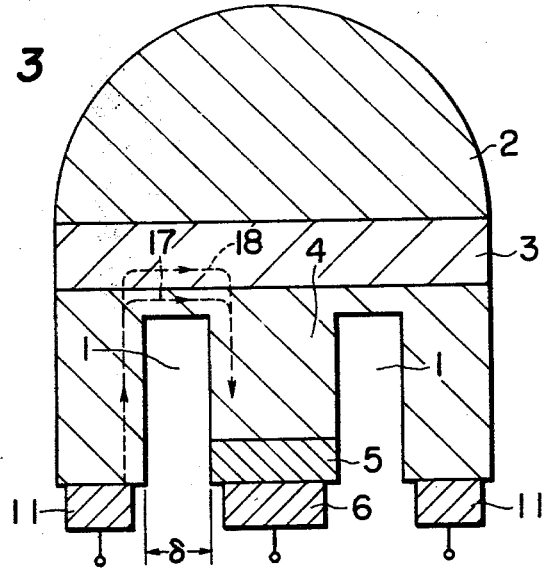

FIG. 3 shows such an embodiment. The distance between the bottom of the ditch 1 and the first conductivity type crystal layer 3 is made at most ½ of the width δ of the ditch 1. Here, the "width δ of the ditch" shall mean the least gap of the crystal surface as formed by the ditch. In the light emitting device having such a structure, the injected carriers are more liable to advance towards the p-n junction through a path 18 than through a path 17. For the reason described previously, therefore, the current density in the plane of the p-n junction becomes homogeneous, and light emission having a uniform intensity distribution can be attained.

The distance between the ditch 1 and the first conductivity type crystal layer 3 needs to be δ/2 or less. When the distance exceeds δ/2, carriers which advance through the path 17 increase, and the current density in the p-n junction 10 becomes inhomogeneous.

Embodiment 3

FIGS. 4(a)–4(d) are sectional views which show the steps of manufacturing a light emitting device of the structure illustrated in FIG. 2.

Figure 4A:
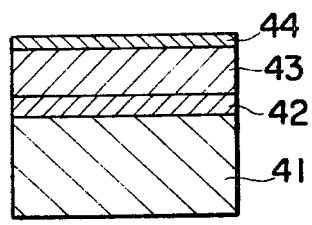
FIGS. 4(a)-4(d), FIGS. 5(a)-5(d) and FIGS. 6(a)-6(d) are views respectively showing processes for manufacturing semiconductor light emitting devices according to this invention.

As shown in FIG. 4(a), a $Ga_{1-x}Al_xAs$ crystal layer 41 in which the mixing ratio x in its surface is at least 0.2 is formed by the liquid growth process, and a $p^{30}$-type $Ga_{1-x}Al_xAs$ layer 42 which is doped with Zn at a high concentration is formed to a thickness of 10 μm similarly by the liquid growth process. When the p+-type $Ga_{1-x}Al_xAs$ layer 42 has its impurity concentration made $3-4 \times 10^{19}$ cm$^{-3}$, its resistivity becomes very low and it becomes a semiconductor layer substantially exhibiting metallic conduction. On this p+ layer, a p-type $Ga_{1-x}Al_xAs$ crystal layer 43 doped with Zn and being 20 μm thick and an n-type $Ga_{1-x}Al_xAs$ crystal layer 44 doped with Te and being 3 μm thick are successively formed by the liquid growth process. The impurity concentrations of these crystal layers 43 and 44 are $1 \times 10^{18}$ cm$^{-3}$ and $1-2 \times 10^{18}$ cm$^{-3}$, respectively.

Figure 4B:
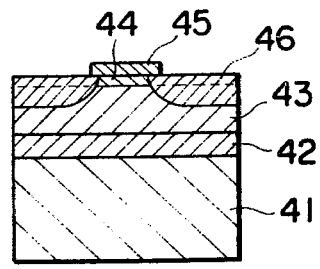

After sufficiently washing and then drying the resultant structure, a double film which consists of an $Al_2O_3$ film 1,000 Å thick and a PSG (phosphosilicate glass) film 2,000 Å thick is formed by the chemical vapor deposition technique. Using the known photolithography, the double film is worked into a desired shape, to form a diffusion mask 45 as shown in FIG. 4(b).

By utilizing the diffusion mask 45 and employing a ternary alloy of Ga-As-Zn as a diffusion source, the ampoule diffusion of Zn is carried out under conditions of 700° C. and 1 hour. Thus, a p+ layer 46 the diffusion depth of which is about 5 μm is formed.

The diffusion mask 45 is removed, a PSG film approximately 5,000 Å thick is deposited over the entire area by the CVD technique, and holes for positive and negative electrodes are provided in the PSG film. Subsequently, as shown in FIG. 4(c), electrode metal films are deposited in the holes by the vacuum-evaporation technique so as to form the ohmic electrodes 47 and 50.

The remaining PSG film is removed. At the next step, a PSG film 48 which is approximately 5,000 Å thick and which is used as a protective film for mesa-etching is deposited over the entire area, and that part of the PSG film at which a ditch is to be provided is removed by the photo-etching.

Figure 4C:
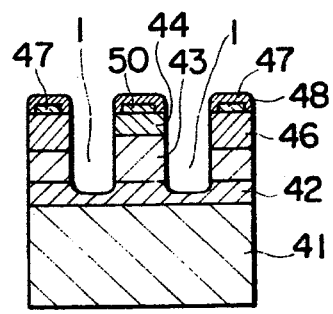

The exposed part is etched with, for example, an etchant in which the composition ratio of ethylene gycol:hydrogen peroxide:sulfuric acid is 3:5:2, and the ditch 1 which extends to the p+-type $Ga_{1-x}Al_xAs$ layer 42 is formed as shown in FIG. 4(c). Although the ditch 1 formed in this case may of course get to the p+-type $Ga_{1-x}Al_xAs$ layer 42 as illustrated in FIG. 4(c), it need not always reach the layer 42 insofar as the ditance between the bottom of the ditch 1 and the layer 42 does not exceed ½ of the width of the ditch 1 as has been explained before. Since the etching rate in this case is about 5 μm/min at an etchant temperature of 18° C., the control of the depth of the ditch is easy.

After removing the PSG film 48, a PSG film 49 which is about 6,000 Å thick is deposited over the whole surface as a protective film, and those parts of the PSG film 49 which overlie the electrodes are removed by the photo-etching.

Figure 4D:
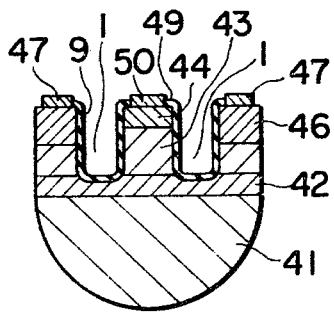

Subsequently, the $Ga_{1-x}Al_xAs$ layer 41 is ground into the semispherical shape by the mechanical-chemical lapping process. Then, a light emitting device having a structure illustrated in FIG. 4(d) is fabricated.

Embodiment 4

Figure 5A:
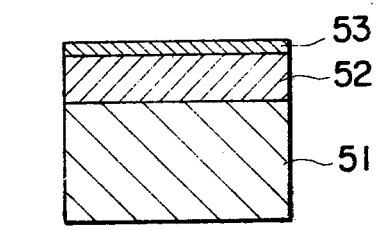

FIGS. 5(a)–5(d) are sectional views which show the steps of manufacturing a light emitting device with a different structure according to this invention. As shown in FIG. 5(a), a p+-type $Ga_{1-x}Al_xAs$ crystal layer 51 in which the mixing ratio x in its surface is 0.2 or greater and which is doped with Zn at a high concentration is formed by the liquid growth process. The carrier concentration of this p+ layer is made $3-4 \times 10^{19}$ cm$^{-3}$ or above. On the crystal layer 51, a p-type $Ga_{1-x}$ Al$_x$As crystal layer (20 μm thick) 52 doped with Zn and an n-type Ga$_{1-x}$Al$_x$As crystal layer (3 μm thick) 53 doped with Te are successively formed by the liquid growth process. The impurity concentrations of the p-type and n-type crystals 52 and 53 are $1 \times 10^{18}$ cm$^{-3}$ and $1-2 \times 10^{18}$ cm$^{-3}$, respectively.

Figure 5B:
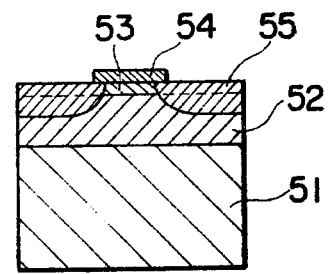

The resultant structure is sufficiently washed and dried, whereupon a double film which consists of an Al$_2$O$_3$ film about 1,000 Å thick and a PSG film about 2,000 Å thick is formed on the crystal layer 53 by the chemical vapor deposition technique. It is worked into a desired shape by the photo-etching, to form a diffusion mask 54 as shown in FIG. 5(b).

Using a ternary alloy of Ga-As-Zn as a diffusion source, the ampoule diffusion of Zn is carried out at 700° C. for 1.5 hours. Then, a p+layer 55 the diffusion depth of which is approximately 5 μm is formed.

Figure 5C:
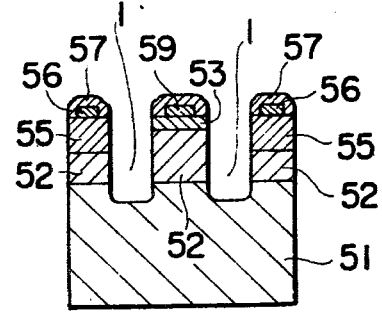

After removing the diffusion mask 54, a PSG film about 5,000 Å thick is deposited over the entire area by the CVD process and is provided with holes for positive and negative electrodes. Subsequently, as illustrated in FIG. 5(c), electrode metal films are deposited in the holes by the vacuum-evaporation process so as to form the ohmic electrodes 56 and 59.

The remaining PSG film is removed. Subsequently, a PSG film 57 which has a thickness of about 5,000 Å and which is used as a protective film against mesa-etching is deposited over the entire area, and that part of this PSG film at which a ditch is to be provided is removed by the photo-etching.

The exposed part is etched by the use of an etchant in which the composition ratio of ethylene glycol:hydrogen peroxide:sulfuric acid is 3:5:2. Thus, the ditch (mesa-etched portion) 1 is provided so that its fore end may reach the p+-type crystal layer 51 having a wide band gap. The ditch 1 formed in this case may of course get to the p+-type Ga$_{1-x}$Al$_x$As crystal layer 51 as depicted in FIG. 5(c). As previously set forth, however, it need not always extend to the crystal layer 51 insofar as the distance between the bottom of the ditch 1 and the crystal layer 51 is at most ½ of the width of the ditch 1. The etching rate at this time is approximately 5 μm/min at an etchant temperature of 18° C., so that the depth of the ditch is easily controlled.

Figure 5D:
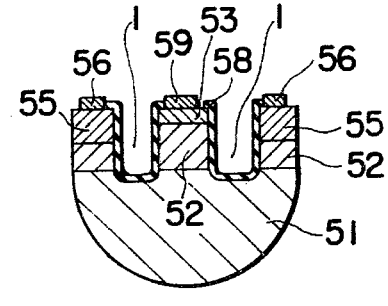

After removing the PSG film 57, a PSG film 58 which is about 6,000 Å thick is deposited over the entire surface as a protective film, and those parts of the PSG film 58 which overlie the electrodes are removed by the photo-etching. Lastly, the crystal layer 51 is ground into the semispherical shape by the mechanical-chemical lapping process. Then, a light emitting device of a structure shown in FIG. 5(d) is fabricated.

Embodiment 5

FIGS. 6(a)-6(d) are sectional views which show the steps of manufacturing a light emitting device with another structure according to this invention.

Figure 6A:
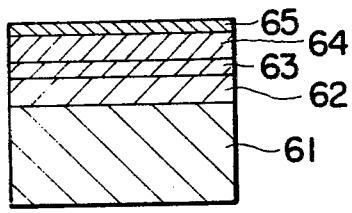

As shown in FIG. 6(a), on a Ga$_{1-x}$Al$_x$As crystal layer 61 which is obtained by the liquid growth process and in which the mixing ratio x in its surface is not less than 0.2, a p-type Ga$_{1-x}$Al$_x$As crystal layer 62 having a thickness of about 10 μm and doped with Zn and a p+-type Ga$_{1-x}$Al$_x$As layer 63 having a thickness of about 3 μm and doped with Zn at a high concentration are successively formed also by the liquid growth process. The carrier concentration of the p-type crystal layer 62 is made $1 \times 10^{18}$ cm$^{-3}$, while that of the p+-type crystal layer 63 is made $3-4 \times 10^{19}$ cm$^{-3}$ or higher.

Subsequently, on the p+layer 63, a p-type Ga$_{1-x}$Al$_x$As crystal layer 64 being about 10 μm thick and doped with Zn and an n-type Ga$_{1-x}$Al$_x$As layer 65 being about 3 μm thick and doped with Te are successively formed by the liquid growth process. The impurity concentrations of the p-type and n-type crystal layers 64 and 65 are $1 \times 10^{18}$ cm$^{-3}$ and $1-2 \times 10^{18}$ cm$^{-3}$, respectively.

Figure 6C:
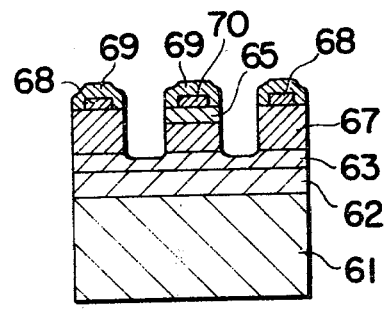
Figure 6B:
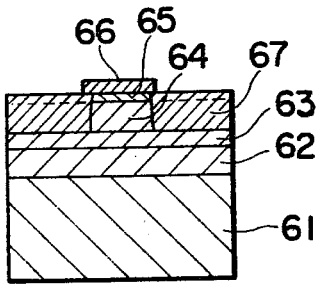

After sufficiently washing and then drying the resultant structure, a double film which consists of an Al$_2$O$_3$ film about 1,000 Å thick and a PSG film about 2,000 Å thick is formed on the crystal layer 65 by the chemical vapor deposition process. It is worked into a desired shape by the photo-etching, to form a diffusion mask 66 as shown in FIG. 6(b).

Using a ternary alloy of Ga-As-Zn as a diffusion source, the ampoule diffusion of Zn is executed at 700° C. for 1.5 hours. Then, a p+layer 67 whose diffusion depth is about 5 μm is formed as shown in FIG. 6(b).

The diffusion mask 66 is removed. A PSG film which is about 5,000 Å thick is deposited over the entire area by the chemical vapor deposition technique, and is provided with holes for positive and negative electrodes. Subsequently, as shown in FIG. 6(c), electrode metal films are deposited in the holes by the vacuum-evaporation process so as to form the ohmic electrodes 68 and 70.

The remaining PSG film is removed, whereupon a PSG film 69 which is about 5,000 Å thick and which is used as a protective film against mesa-etching is deposited over the whole surface. That part of this PSG film at which a ditch is to be provided is removed by the photo-etching.

Using an etchant in which the composition ratio of ethylene glycol:hydrogen peroxide:sulfuric acid is 3:5:2, the exposed part is etched until the fore end of the ditch reaches the p+-type layer 63 or until the distance between the fore end of the ditch and the p+-type layer 63 becomes at most ½ of the width of the ditch.

After removing the protective film for mesa-etching 69, a PSG film 71 which is about 6,000 Å thick is deposited as a surface passivating film, and those parts of the PSG film 71 which overlie the electrodes 68 and 70 and their peripheral parts are removed by the photo-etching process.

Figure 6D:
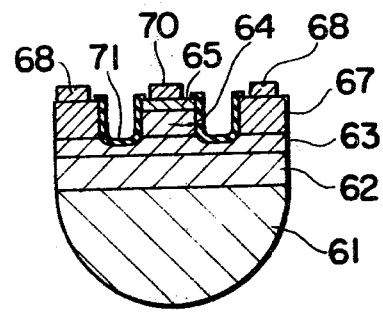

Lastly, the Ga$_{1-x}$Al$_x$As layer 61 is worked into the semispherical shape by the mechanical-chemical lapping process. Then, a light emitting semiconductor device shown in FIG. 6(d) is fabricated.

Embodiment 6

Any of the foregoing embodiments has been such that the light projecting surface is semispherical and that both the electrodes are formed on the identical plane. It is a matter of course, however, that the invention is not restricted to devices of such a configuration. Even when the light projecting surface is flat and the positive and negative electrodes are formed on different planes, the same effect is achieved.

Figure 7:
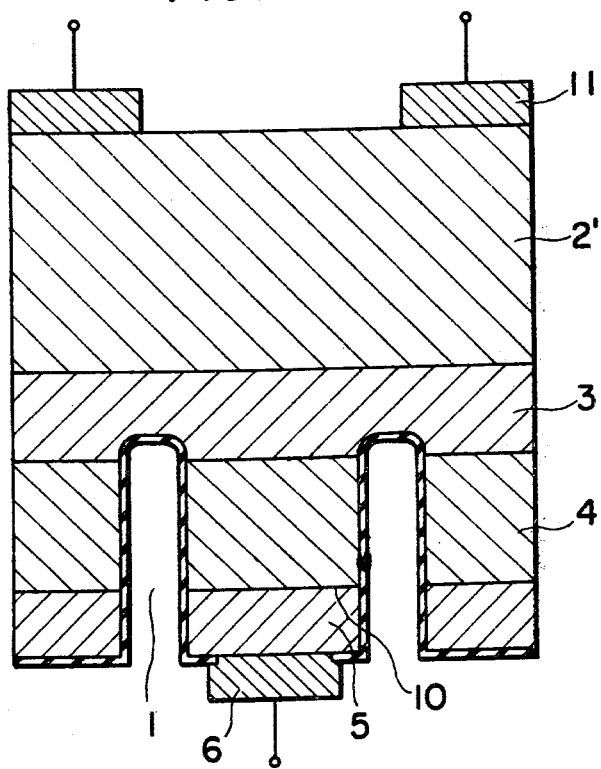
FIG. 7 is a view showing another embodiment of this invention.

FIG. 7 shows an example of a device having such a structure. A p-type Ga$_{1-x}$Al$_x$As layer 4, an n-type Ga$_{1-x}$Al$_x$As layer 5, a p+-type Ga$_{1-x}$Al$_x$As layer 3, a ditch 1, a p-n junction 10 and a negative electrode 6 are all the same as in the case of the device illustrated in FIG. 2. As seen from FIG. 7, however, a thick p-type Ga$_{1-x}$Al$_x$As layer 2' on the light emitting side is not semispherical but has a flat surface, and a positive electrode 11 is formed on the p-type Ga$_{1-x}$Al$_x$As layer 2'.

Although FIG. 7 illustrates the case where the ditch 1 extends to the interior of the low-resistance p-type semiconductor layer 3, it is a matter of course that the bottom of the ditch 1 need not reach the layer 3 unless the distance between them exceeds ½ of the width of the ditch 1.

Even with such a structure, the density of current injected into the p-n junction is homogeneous, and light emission of uniform intensity distribution is attained.

In any of the foregoing embodiments, the p-n junction has been formed by the use of the $Ga_{1-x}Al_xAs$ layer formed by the liquid epitaxial growth. In this invention, however, not only the liquid epitaxial growth but also the diffusion can be used for forming the layer. Needless to say, the layer is not restricted to $Ga_{1-x}Al_xAs$, but it can be similarly formed of other materials such as $GaP-Ga_{1-x}In_xP$ and $GaP-GaAs_{1-x}P_x$.

What is claimed is:

1. A light emitting semiconductor device comprising a p-n junction which is made up of semiconductor layers of first and second conductivity types, a low-resistance semiconductor layer which adjoins the first conductivity type semiconductor layer and which contains large quantities of impurity of said first conductivity type therein, a semiconductor layer for giving out light which adjoins said low-resistance semiconductor layer and which has said first conductivity type, and a ditch which is provided from a surface of said second conductivity type semiconductor layer in a manner to surround said p-n junction, a distance between a bottom of said ditch and said low-resistance semiconductor layer being at most ½ of a width of said ditch.

2. A light emitting semiconductor device according to claim 1, wherein a surface of said semiconductor layer for giving out light is substantially semispherical, and a positive electrode and a negative electrode are formed on the surface on an identical side of the semiconductor body.

3. A light emitting semiconductor device according to claim 2, wherein said first conductivity type is the p-type, while said second conductivity type is the n-type.

4. A light emitting semiconductor device according to claim 2, wherein said bottom of said ditch reaches said low-resistance semiconductor layer.

5. A light emitting semiconductor device according to claim 2, wherein said bottom of said ditch lies in said first conductivity type semiconductor layer.

6. A light emitting semiconductor device according to claim 1, wherein a surface of said semiconductor layer for giving out light is flat.

7. A light emitting semiconductor device according to claim 6, wherein said first conductivity type is the p-type, while said second conductivity type is the n-type.

8. A light emitting semiconductor device according to claim 6, wherein said bottom of said ditch reaches said low-resistance semiconductor layer.

9. A light emitting semiconductor device according to claim 6, wherein said bottom of said ditch lies in said first conductivity type semiconductor layer.

10. A light emitting semiconductor device according to claim 6, further comprising a first electrode having a first potential coupled to said flat surface of said semiconductor layer for giving out light, and a second electrode having a second potential coupled to said second conductivity type semiconductor layer.

11. A light emitting semiconductor device according to claim 10, wherein said first potential is a positive potential, and said second potential is a negative potential.

* * * * *